United States Patent [19]

Rufford

[11] 4,357,687

[45] Nov. 2, 1982

[54] ADAPTIVE WORD LINE PULL DOWN

[75] Inventor: Roger V. Rufford, Redwood City, Calif.

[73] Assignee: Fairchild Camera and Instr. Corp., Mountain View, Calif.

[21] Appl. No.: 215,298

[22] Filed: Dec. 11, 1980

[51] Int. Cl.³ .............................. G11C 7/00; G11C 8/00
[52] U.S. Cl. .................................... 365/230; 365/189; 365/204; 365/227; 365/242
[58] Field of Search ............... 365/174, 189, 220, 221, 365/230, 231, 242, 243, 203, 204, 209, 227; 307/449, 463

[56] References Cited
U.S. PATENT DOCUMENTS 3,473,149 10/1969 Ashley ............................ 365/242 X
3,510,856 5/1970 Cline .................................. 365/209
3,546,487 12/1970 Espinal ........................... 365/242 X
3,740,730 6/1973 Ho et al. ............................. 365/230
3,810,124 5/1974 Hoffman et al. ..................... 365/230
4,070,656 1/1978 Heuber et al. ................... 365/204 X
4,174,541 11/1979 Schmitz .............................. 365/230

Primary Examiner—Robert L. Richardson
Attorney, Agent, or Firm—Kenneth Olsen; Paul J. Winters; Theodore Scott Park

[57] ABSTRACT

An adaptive word line pull-down circuit steers a pull-down current only to the word being pulled down and only for the time when that word is being pulled down. The time that it takes for the bottom word line to fall controls how long the pull-down current is steered to the falling word.

9 Claims, 2 Drawing Figures

ADAPTIVE WORD LINE PULL DOWN

BACKGROUND OF THE INVENTION

This invention relates to an apparatus and a method for pulling down the voltage of a word line in a memory.

This invention relates specifically to an apparatus and a method which steers a pull-down current to the word line in response to a signal that a word is to be deaddressed and which is adaptive and self-regulating in that the pull-down current is steered to the word line only as long as the pull-down current is needed to pull the word down.

One conventional form of memory is organized in words and columns. Each word of the memory is associated with a top word line and a bottom word line, and the voltages on the word lines for a particular word must be pulled down from high to low when a word is deaddressed.

The general way of accomplishing the pull down is with a diode coupled pull-down arrangement in which the pull-down current is shared by more than one word.

The primary defect with the prior art is that when a word is being deaddressed, the pull-down current is steered away from that word before the word is fully deaddressed. The plot of the voltage as a function of time shows that the word falls rapidly, then as the word being addressed picks up the pull-down current, the rate of fall of the word being deaddressed decreases. This places an intrinsic lower limit of the cycle time of the memory.

The total current available to remove stored charge in the memory cells is the sum of the cell standby current and the pull-down current. As memory cells evolve, the standby current becomes smaller. Therefore, large pull-down currents are required. In the prior art diode coupled pull down it is required that the addressed word driver supply the static pull-down current. This in turn necessitates the use of large transistors and wide metal lines to ensure long term reliability of operation.

SUMMARY OF THE INVENTION

It is a primary object of the present invention to construct a circuit to pull down memory word lines in a way which avoids the problems of the prior art.

It is a related object of the present invention to avoid the static pull-down current being pulled out of the emitter of the word line transistor.

It is another related object of the present invention to avoid the discontinuity in the fall time of the deaddressed word.

Another object of the present invention is to construct an adaptive word line pull down which is self-regulating in the sense that the circuit only turns on the pull-down current as long as the pull-down current is needed to pull the word down.

A circuit to pull down memory word lins in accordance with the present invention detects a signal that the address of a word is to be changed and amplifies the detected signal. The circuit steers a pull-down current to the bottom word line to commence pulling the word down in response to the amplified signal and maintains the pull-down current on the bottom word line until the word is deaddressed. The circuit detects the fact that the word has been pulled down and steers the pull-down current away from the bottom word line after the word has been deaddressed by detecting and amplifying the bottom word line voltage.

The circuit of the present invention includes a word driver, a level detector and amplifier, a level shifter and pull-down current steerer and a memory cell standby current source.

This circuit eliminates the defects of the prior art diode coupled pull-down circuit by steering the pull-down current only to the word being pulled down and only for the time when that word is being pulled down.

The circuit of the present invention is adaptive. The time that it takes for the bottom word line to fall controls how long the pull-down current is steered to the falling word.

The circuit of the present invention permits the cell standby current to be maintained at a low level to retain data but permits this cell standby current to be increased rapidly when the word is deaddressed. The relatively large cell standby current generated when the word is deaddressed is effective to discharge the word line capacitance rapidly. As a result the voltage in the bottom word line falls rapidly and without a discontinuity in the fall time so that the address can be changed fast.

Other and further objects of the present invention will be apparent from the following description and claims and are illustrated in accompanying drawings which, by way of illustration, show preferred embodiments of the present invention and the principles thereof and what are now considered to be the best modes contemplated for applying these principles. Other embodiments of the invention embodying the same or equivalent principles may be used, and structural changes may be made as desired by those skilled in the art without departing from the present invention and the purview of the appended claims.

BRIEF DESCRIPTION OF THE DRAWINGS

FIG. 2 shows how the cell stand-by current on the bottom word line is maintained at a relatively low level to retain data and is then increased rapidly to a relatively high peak current to pull down the word line voltage rapidly and continuously when a word is deaddressed.

FIG. 2 also shows, in the curve at the top of FIG. 2, the substantially higher level of cell stand-by and pull-down current required by the prior art word line pull-down curcuits.

DESCRIPTION OF THE PREFERRED EMBODIMENTS

Figure 1:
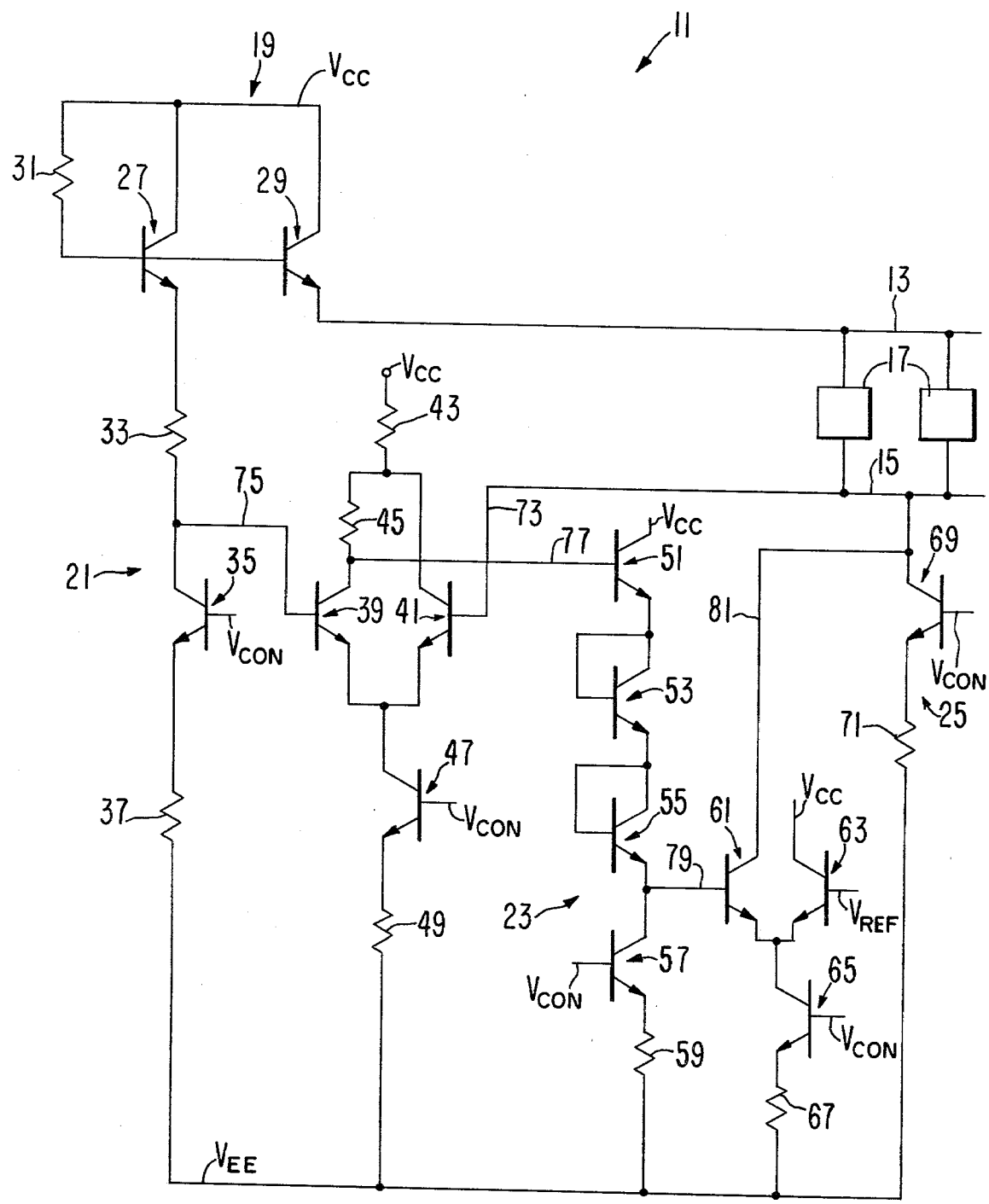
FIG. 1 is a schematic diagram of an adaptive word line pull-down circuit constructed in accordance with one embodiment of the present invention.

An adaptive word-line pull-down circuit constructed in accordance with one embodiment of the present invention is indicated generally by the reference numeral 11 in FIG. 1.

The circuit 11 shown in FIG. 1 is used with each word in a memory.

A top line 13 and a bottom line 15 for a single word of the memory are shown in FIG. 1 with memory cells 17.

The circuit 11 includes the following major components.

The circuit 11 includes a word driver 19, a level detector and amplifier 21, a level shifter and pull-down current steerer 23, and a memory cell stand-by current source 25.

The memory cell stand-by current source 25 is associated with the circuit 11, but it is not an integral part of that circuit.

The word-driver 19 includes two transistors 27 and 29 and a resistor 31.

The transistor 29 is the voltage source for the top word line 13.

The transistor 27 is the signal source for the level detector and amplifier 21.

The level detector and amplifier 21 includes a resistor 33, a transistor 35 and a resistor 37 connected in series. The transistor 35 and resistor 37 are a constant current generator and are associated with the resistor 33 to provide a level shifter.

The level detector and amplifier 21 also includes transistors 39 and 41, resistors 43 and 45 and a transistor 47 and a resistor 49 connected in series. The transistors 39, 41, 47 and the resistor 49 are a current switch. The resistors 43 and 45 are the collector load on the transistor 39.

The level shifter and pull-down current steerer 23 includes four transistors 51, 53, 55 and 57 and a resistor 59. In a specific embodiment of the invention each of the three transistors gives a constant one base emitter voltage drop.

The level shifter and pull-down current steerer 23 also includes the transistors 61 and 63 and a transistor 65 and a resistor 67 which constitute another current switch used for steering the pull-down current. The magnitude of the pull-down current is set by the current source provided by the transistor 65 and the resistor 71.

The memory cell stand-by current source 25 includes a transistor 69 and a resistor 71.

The bases of each of the transistors 35, 47, 57, 65 and 69 go to a constant voltage source reference $V_{CON}$. $V_{CON}$ is a fixed positive voltage with respect to $V_{EE}$.

The word driver 19 includes the $V_{CC}$ line, and this power supply voltage $V_{CC}$ is also connected to the collector of the transistor 51 and collector of the transistor 63 and to one end of the resistor 43 as illustrated in FIG. 1.

The base of the transistor 41 is connected to the top word line 13 by a line 73.

The collector of the transistor 35 is connected to the base of the transistor 39 by a line 75.

The collector of the transistor 39 is connected to the base of the transistor 51 by a line 77.

The emitter of the transistor 55 is connected to the base of the transistor 61 by a line 79.

The collector of the transistor 61 is connected to the bottom word line 15 by a line 81.

It is an important feature of the circuit 11 shown in FIG. 1 that the cell stand-by current on the bottom word line 15 needs to be maintained at only a relatively low level to retain data. A low level of cell stand-by current reduces the required width of the metal for the word lines and also reduces the required size of the word driver transistor, as compared to the prior art diode coupled pull-down methods and structures.

It is another important feature of the present invention that there is no static pull-down current pulled out of the emitter of the word driver transistor, as was required in the prior art. The static pull-down current of the present invention flows down the detector of the transistor 63, as will be described below, and does not come out of the bottom word line 15.

The pull-down current rises rapidly in response to a signal that a word is to be deaddressed and causes the voltage in the bottom word line to fall rapidly and without a discontinuity in the fall time, in contrast to the discontinuity in fall time as occurred in the prior art. With the present invention the address can be changed fast.

Other important benefits of the present invention are that the circuit steers the pull-down current only to the word being pulled down and only for the time when the word is being pulled down. The circuit of the present invention is adaptive and self-regulating in that the time that it takes for the bottom word line to fall controls how long the pull-down current is steered to the falling word.

As noted above, each word has a top word line 13 and a bottom word line 15. When the word between these lines is to be deaddressed, the voltage on the bottom line 15 has to be pulled down.

The circuit 11 of the present invention accomplishes this pulling down of the voltage on the bottom word line 15 in the following manner.

Figure 2:
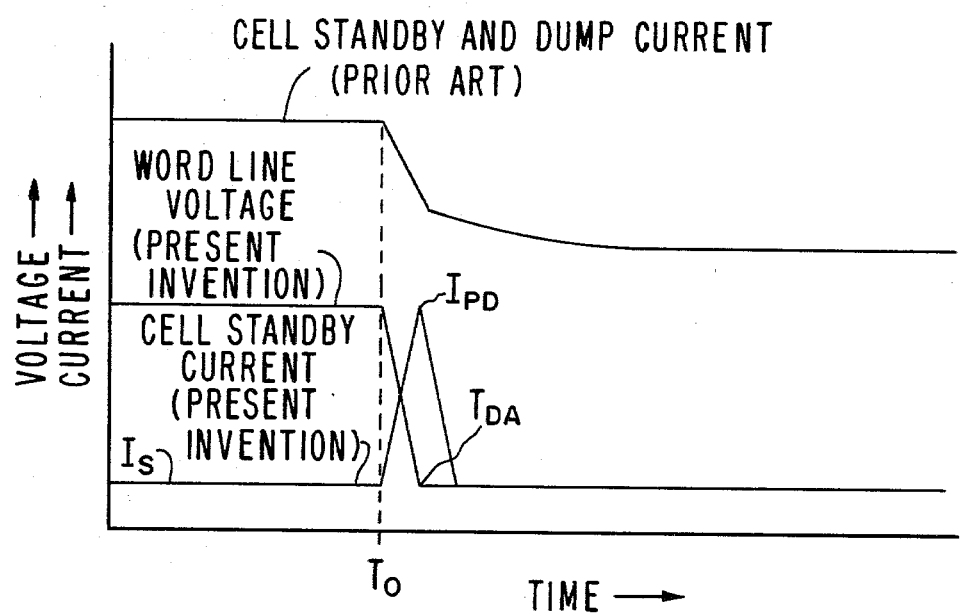
FIG. 2 is a graph showing the relationship between the cell stand-by current and the word line voltage of the present invention.

In the operation of the circuit 11 the current in the bottom word line 15 is increased for the purpose of pulling down the voltage on bottom word line 15 as shown in FIG. 2. That is, as illustrated in FIG. 2, the cell stand-by current $I_S$ on the line 15 is increased rapidly to a level indicated as $I_{PD}$ and is then returned to the $I_S$ level when the word is deaddressed.

This mode of operation has the advantage of requiring only relatively low stand-by current and also permitting a relatively large current to be generated to discharge the word line capacitance rapidly.

The conditions existing prior to the deaddressing of the word are as follows. With the word addressed the bases of the transistors 27 and 29 are high; and the level shift produced by the resistor 33, the transistor 35 and the resistor 37 sets the base of the transistor 39 at a voltage sufficiently higher than the voltage of the base of the transistor 41 so as to cause the constant current generated by transistor 47 and resistor 49 to flow through resistors 43, 45 and transistor 39.

At a time prior to deaddressing a word (prior to $T_O$ as indicated in FIG. 2), the base of transistor 27 is high. The voltage on the emitter of the transistor 27 is shifted and detected by the level shifter and amplifier 21. The shifted level on the base of the transistor 38 is higher than the level on the base of the transistor 41; consequently, the collector of the transistor 38 is low. The level shifter consisting of the transistors 51, 53, 55, 57 and the resistor 59 applies the shifted collector voltage of the transistor 38 to the base of the transistor 61 such that the base of the transistor 61 is lower than the base of the transistor 63. Consequently, the pull-down current flows through the collector of the transistor 63 and not out of the bottom word line 15.

The start of the deaddressing of a word (at a time $T_O$ as indicated in FIG. 2) is detected by when the base of the transistor 27 is pulled down. This pulling down of the base of the transistor 27 is caused by address input buffers and decoders.

The signal produced by the pulling down of the base of the transistor 27 is detected by the level detector and amplifier 21. When the base of the transistor 27 is pulled down to deaddress the word, the level shifter comprised of resistor 33, resistor 37 and transistor 35 removes the base drive to the transistor 39. The base of the transistor 41 remains high because the memory cell stand-by current source 25 cannot pull the bottom word line down. Consequently the collector of the transistor 39 rises. This increment in voltage is shifted down by the level shifter 23.

The transistors 51, 53, 55 and 57 and the resistor 59 of the level shifter 23 shift the collector voltage on the transistor 39 down and apply the shifted voltage to the base of the transistor 61.

The resulting voltage on the base of the transistor 61 is higher than the reference voltage on the base of the transistor 63 causing the pull-down current which is generated by the transistor 65 and the resistor 67 to be steered through transistor 61 and pulled out of the bottom word line 15.

This causes the big spike of pull-down current as illustrated at $I_{PD}$ in FIG. 2. It also causes the word line 15 voltage to start falling, and the voltage falls rapidly and without a discontinuity in the rate of fall off as a consequence of the large pull-down current.

One of the benefits of the circuit 11 is that the pull-down current can be made large enough to pull voltage down fast even with relatively large capacitances in the memory cells 17.

The voltage difference between the bottom word line 15 and the top word line 13 is a constant which is controlled by memory cell characteristics and the stand-by current. Thus, as the voltage on the bottom word line 15 drops off rapidly the voltage on the top word line 13 also follows it down.

The word becomes deaddressed at a time $T_{DA}$ as indicated on the falling word line voltage curve and on the down side of the current spike.

Since the bottom word line 15 is connected to the base of the transistor 41 by the line 73, the drop in the voltage on the top word line 15 lowers the voltage on the base of the transistor 41 below the voltage on the base of the transistor 39.

This change in the relative levels of the voltage on the bases of the two transistors 41 and 39 then steers the constant current generated by the transistor 47 and the resistor 49 back through the resistors 43 and 45 and the transistor 39.

The resulting effect on the collector of the transistor 39 is then shifted through the level shifter 23 to cause the base of the transistor 61 to be below the base of the transistor 63. This steers the stand-by current back through the transistor 63. The word is now deaddressed and the pull-down current is now turned off.

While I have illustrated and described the preferred embodiments of my invention, it is to be understood that these are capable of variation and modification, and I therefore do not wish to be limited to the precise details set forth, but desire to avail myself of such changes and alterations as fall within the purview of the following claims.

I claim:

1. A method for pulling down the word line voltage when a word is to be deaddressed in a memory of the kind having a plurality of words, with each word associated with a top word line and a bottom word line, said method comprising, detecting a signal that the address of a word is to be changed, amplifying the detected signal, steering a pull-down current to the bottom word line to commence pulling the word down in response to the amplified signal, maintaining that pull-down current on the bottom word line until the word is deaddressed, detecting the fact that the word has been pulled down, and steering the pull-down current away from the bottom pull-down line after the word has been deaddressed by detecting and amplifying the voltage of one of the word lines.

2. The method defined in claim 1 wherein the bottom word line voltage is detected and amplified to steer the pull-down current away from the bottom pull-down line after the word has been deaddressed.

3. The method defined in claim 1 including a current source for supplying the pull-down current and wherein the steering includes connecting the current source either to the bottom word line or to the positive supply voltage so that no static pull-down current is pulled out of any word driver.

4. The invention defined in claim 3 including a separate steering means for each word so that the pull-down current is not shared by more than one word.

5. Apparatus for pulling down the word line voltage when a word is to be deaddressed in a memory of the kind having a plurality of words and a top word line and a bottom word line associated with each word, said apparatus comprising, detecting means for detecting a signal that the address of a word is to be changed, amplifying means operatively associated with the detecting means for amplifying the detected signal, steering means operatively associated with the amplifying means for steering a pull-down current to the bottom word line to commence pulling the word down in response to the amplified signal and for maintaining that pull-down current on the bottom word line until the word is deaddressed, said amplifying means including current switch means operatively associated with a word line for detecting the fact that the word has been pulled down and effective to cause the level shifter and steering means to steer the pull-down current away from the bottom pull-down line after the word has been deaddressed.

6. The invention defined in claim 5 including level shifter means connected between the amplifying means and the steering means for shifting a voltage down to insure operation of the steering means in a normal manner.

7. The invention defined in claim 5 wherein the current switch means are operatively associated with the bottom word line.

8. The invention defined in claim 5 including a current source for supplying the pull-down current and wherein the steering means include a switch effective to connect the current source either to the bottom word line or to the positive supply voltage so that no static pull-down current is pulled out of any word driver.

9. The invention defined in claim 8 including a separate steering means for each word so that the pull-down current is not shared by more than one word.

* * * * *